United States Patent
Needham et al.

(10) Patent No.: US 10,427,785 B2
(45) Date of Patent: Oct. 1, 2019

(54) POWER HARVESTING DRONE

(71) Applicant: Intel Corporation, Santa Clara, CA (US)

(72) Inventors: Bradford H. Needham, North Plains, OR (US); Douglas Paul Bogia, Forest Grove, OR (US)

(73) Assignee: Intel Corporation, Santa Clara, CA (US)

( * ) Notice: Subject to any disclaimer, the term of this patent is extended or adjusted under 35 U.S.C. 154(b) by 155 days.

(21) Appl. No.: 15/476,558

(22) Filed: Mar. 31, 2017

(65) Prior Publication Data
US 2018/0281945 A1    Oct. 4, 2018

(51) Int. Cl.
*B64C 39/02*    (2006.01)
*G06T 7/70*    (2017.01)
*H01L 35/28*    (2006.01)
*H02J 7/02*    (2016.01)
*H02N 2/18*    (2006.01)

(52) U.S. Cl.
CPC .............. *B64C 39/024* (2013.01); *G06T 7/70* (2017.01); *H01L 35/28* (2013.01); *H02J 7/025* (2013.01); *H02N 2/186* (2013.01); *B64C 2201/063* (2013.01); *B64C 2201/066* (2013.01); *B64C 2201/141* (2013.01); *B64C 2201/145* (2013.01); *G06T 2207/10048* (2013.01)

(58) Field of Classification Search
CPC combination set(s) only.
See application file for complete search history.

(56) References Cited

U.S. PATENT DOCUMENTS

2017/0015415 A1*  1/2017  Chan ................... B64C 39/024
2017/0039861 A1*  2/2017  Ceribelli ............. G05D 1/0005

OTHER PUBLICATIONS

Amar, Achraf Ben, "Power Approaches for Implantable Medical Devices", MC US National Library of Medicine National Institutes of HealthSensory courtesy of Multidisciplinary Digital Publishing Institute (MDPI), [Online]. Retrieved from the Internet: URL: Power Approaches for Implantable Medical Devices, (Nov. 13, 2015), 21 pages.

* cited by examiner

*Primary Examiner* — Thomas G Black
*Assistant Examiner* — Ana D Thomas
(74) *Attorney, Agent, or Firm* — Schwegman Lundberg & Woessner, P.A.

(57) ABSTRACT

Various systems and methods for providing and deploying a power harvesting drone are described herein. A power harvesting drone includes a motor assembly; an energy replenishment coupler; a processor communicatively coupled to the energy replenishment coupler; and a memory storing instructions, which when executed by the processor cause the processor to: operate the power harvesting drone to navigate a predetermined path; determine that a power supply used to operate the power harvesting drone is below a threshold of remaining power; identify an opportunistic energy source; and deviate from the predetermined path to replenish at least a portion of the power supply from the opportunistic energy source using the energy replenishment coupler onboard the power harvesting drone.

22 Claims, 3 Drawing Sheets

POWER HARVESTING DRONE

TECHNICAL FIELD

Embodiments described herein generally relate to drones and related hardware interfaces and in particular, to a power harvesting drone.

BACKGROUND

An unmanned aerial vehicle (UAV), commonly known as a drone, is an aircraft without a human pilot aboard. The size of drones may range from small hobby scale size suitable for close range operation proximate a user to large scale systems capable of hauling payloads over many miles. Drones may be used to provide services, perform military operations to reduce risk to human pilots, as entertainment, or the like.

BRIEF DESCRIPTION OF THE DRAWINGS

In the drawings, which are not necessarily drawn to scale, like numerals may describe similar components in different views. Like numerals having different letter suffixes may represent different instances of similar components. Some embodiments are illustrated by way of example, and not limitation, in the figures of the accompanying drawings in which.

DETAILED DESCRIPTION

In the following description, for purposes of explanation, numerous specific details are set forth in order to provide a thorough understanding of some example embodiments. It will be evident, however, to one skilled in the art that the present disclosure may be practiced without these specific details.

Drones are typically powered by an onboard battery supply. However, as drones are becoming more and more popular and use times increase, battery density is not scaling to keep up with these usages. Thus, the range and service time of drones are limited. By improving the duty cycle of a drone, additional capabilities become available for a user or a business that operates the drone. As disclosed herein, various charging methods may be used for charging drone batteries during operational duty. Drones may seek out and implement opportunistic recharging to stay in the field longer or perform tasks that require recharging in order to complete the task.

In general, a drone's power supply is limited by weight. This constraint in turn places a limit on the distance the drone is able to travel without refueling (energy replenishment). Several methods of drone refueling have been proposed, such as in-flight battery swap, recharging stations placed throughout the drone's operational area, and the like. However, these methods of refueling require that special-purpose infrastructure be developed and installed for any area in which the drone may operate.

Opportunistic refueling is a term that refers to a drone's capability to refuel while in the field from fuel sources that are available. These fuel sources may be non-conventional and ubiquitous, such as a stream or river, wind, sun, high-power lines, animals, and the like. Some fuel sources may be considered waste or byproducts of the power producer, in which case a drone that siphons power to refuels is not draining the power producer. An example is a situation where a drone is able to refuel based on the heat output from a power turbine. Another example is the mechanical vibrations produced by a vehicle as its traveling over a road surface. Various modes and mechanisms to refuel a drone are described herein.

Figure 1:
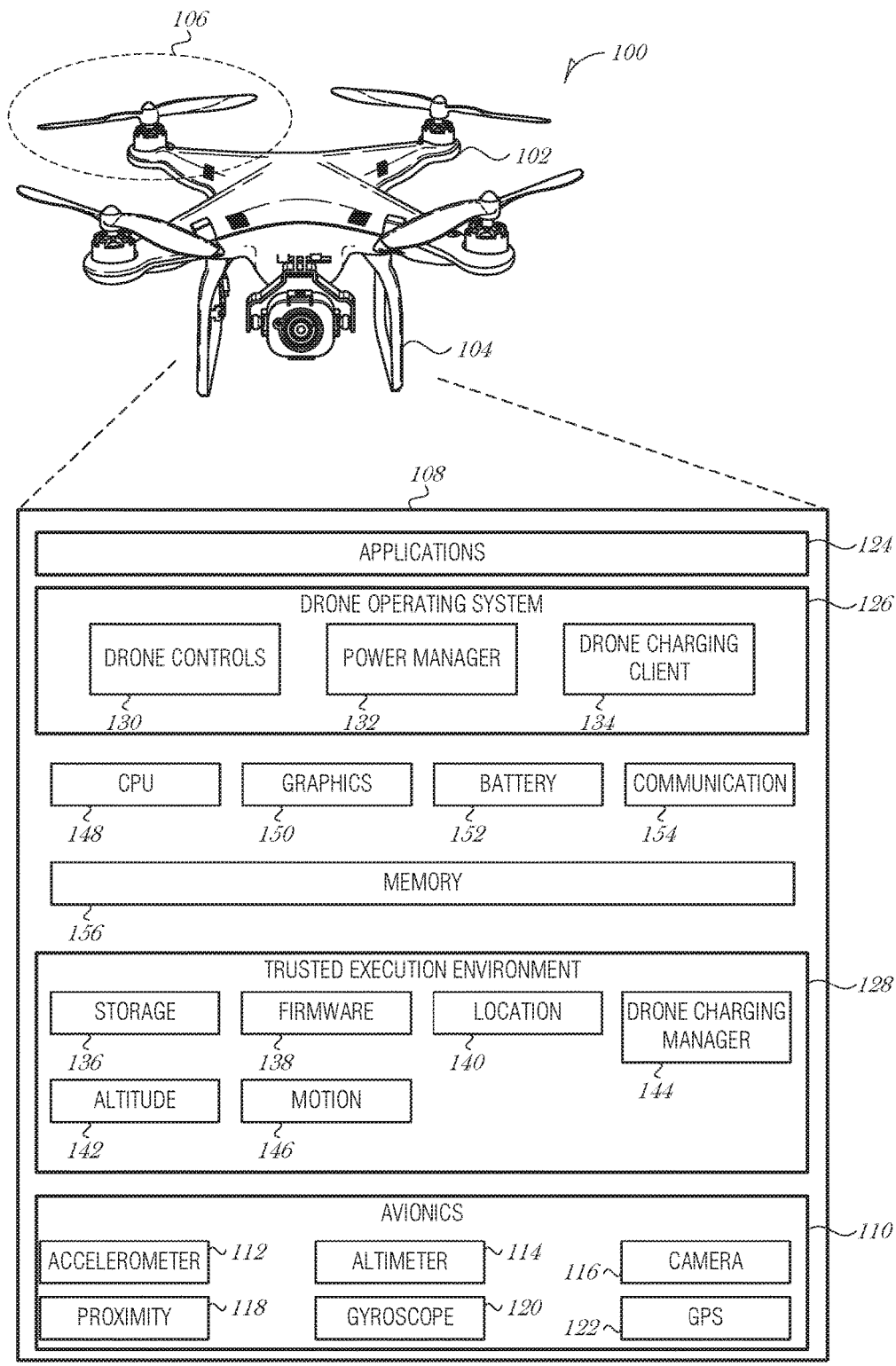
FIG. 1 is a block diagram illustrating a drone, according to an embodiment.

FIG. 1 is a block diagram illustrating a drone 100, according to an embodiment. The drone 100 may include an airframe 102, a power harvesting mechanism 104, a flight mechanism 106, and a control environment 108. The airframe 102 may be made of polymers, metals, etc. Other components of the drone 100 may be secured to the airframe 102.

The power harvesting mechanism 104 may be one of a variety of mechanisms capable of harvesting power from the surrounding environment. The power harvesting mechanism 104 may support multiple modes or mechanisms to harvest energy from different types of sources. In an embodiment, the power harvesting mechanism 104 includes an inductive clamp, which the drone 100 may use to attach to or couple with an electric power line and recharge the drone 100.

In another embodiment, the power harvesting mechanism 104 includes a syringe or other bloodletting device and a collection mechanism to collect blood from a host. The blood may be processed to extract glucose, which may then be used recharge a bio-fuel cell. In such an embodiment, the drone 100 may land or otherwise couple to a living host, such as a cow or a horse, and extract blood to harvest energy.

In another embodiment, the power harvesting mechanism 104 includes a turbine, either wind or water, that is able to convert mechanical energy into electrical energy. For instance, the drone 100 may perch on a tree limb and power off everything except the essential systems to recharge. A wind turbine may be activated or deployed from the airframe 104, and be used to harvest power from the wind. Another example is that the drone 100 may land on a moving vehicle, such as a passenger vehicle. While riding on the vehicle, the drone 100 may deploy a wind turbine to recharge the battery 152. As yet another example, the drone 100 may identify a running stream or river and navigate to a position on the bank. The drone may deploy a water turbine mechanism into the running water to recharge the battery 152.

In another embodiment, the power harvesting mechanism 104 includes a vibration-powered generator. A vibration-powered generator is a type of electric generator that is able to convert mechanical (e.g., kinetic) energy into electric energy. The vibration-powered generator may implement one or more electromagnetic generators or piezoelectric generators. The vibration-powered generator may be activated after landing on a vehicle, thereby converting the vehicle's motion into electrical energy to recharge the battery 152. The vibration-powered generator may be used in conjunction with a wind turbine to further increase the recharge rate.

In another embodiment, the power harvesting mechanism 104 includes a thermoelectric generator. A thermoelectric generator is a system that converts ambient heat (e.g., thermal energy) into electrical energy using the Seebeck effect. Waste heat from a transformer, vehicle exhaust, a smokestack, or other high-temperature places may be captured by drone 100 to convert some of the waste heat into electrical energy and recharge the battery 152.

The flight mechanism 106 may include mechanisms that propel the drone 100 through the air. For example, the flight mechanism 106 may include propellers, rotors, turbofans, turboprops, etc. The flight mechanism 106 may operably interface with avionics 110. The avionics 110 may be part of the control environment 108 (as shown in FIG. 1) or as standalone components. The avionics 110 may include an accelerometer 112, an altimeter 114, a camera 116, proximity sensors 118, gyroscopes 120, and a global positioning system (GPS) receiver 122.

The various components of the avionics 110 may be standalone components or may be part of an autopilot system or other avionics package. For example, the altimeter 114 and GPS receiver 122 may be part of an autopilot system that include one or more axes of control. For instance, the autopilot system may be a two-axis autopilot that may maintain a preset course and hold a preset altitude. The avionics 110 may be used to control in-flight orientation of the drone 100. For example, the avionics 110 may be used to control orientation of the drone 100 about pitch, bank, and yaw axes while in flight. As the drone 100 approaches a power source, the drone 100 may need to maintain a particular angle, position, or orientation in order to facilitate coupling with the power source.

In many cases, the drone 100 operates autonomously within the parameters of some general protocol. For example, the drone 100 may be directed to deliver a package to a certain residential address or a particular geo-coordinate. The drone 100 may act to achieve this directive using whatever resources it may encounter along the way.

In other cases where the drone 100 does not operate in fully autonomous mode, the camera 116 may allow an operator to pilot the drone 100. Non-autonomous, or manual flight, may be performed for a portion of the drone's operational duty cycle, while the rest of the duty cycle is performed autonomously.

The computing environment 108 may also include applications 124, a drone operating system (OS) 126, and a trusted execution environment (TEE) 128. The applications 124 may include services to be provided by the drone 100. For example, the applications 124 may include a surveillance program that may utilize the camera 116 to perform aerial surveillance. The applications 124 may include a communications program that allows the drone 100 to act as a cellular repeater or a mobile Wi-Fi hotspot. Other applications may be used to operate or add additional functionality to the drone 100. Applications may allow the drone 100 to monitor vehicle traffic, survey disaster areas, deliver packages, perform land surveys, perform in light shows, or other activities including those described elsewhere in this document.

The drone OS 126 may include drone controls 130, a power management program 132, and a drone charging client 134. The drone controls 130 may interface with the avionics 110 to control flight of the drone 100. The drone controls 130 may optionally be a component of the avionics 110, or be located partly in the avionics 110 and partly in the drone OS 126. The power management program 132 may be used to activate the power harvesting mechanism 104. In addition, the power management program 132 may be used to determine a power consumption of the drone 100 during a flight. For example, the drone 100 may need a certain amount of energy to fly to a destination and return to base. Thus, in order to complete a roundtrip mission, the drone 100 may need a certain battery capacity. As a result, the power management program 132 may cause the drone 100 to terminate a mission and return to base.

The drone charging client 134 may control the power harvesting mechanism 104. For example, the drone charging client 134 may include data regarding various charging protocols. During a mission, the drone charging client 134 may initialize an appropriate charging protocol for a given in-flight drone.

The TEE 128 may provide secured storage 136, firmware, drivers and kernel 138, a location processing program 140, an altitude management program 142, a drone charging manager 144, and a motion processing program 146. The components of the TEE 128 may operate in conjunction with other components of the drone 100. For example, the drone charging manager 144 may operate with the drone charging client 134 during recharging. The altitude management program 142 may operate with the avionics 110 during flight.

The TEE 128 may provide a secure area for storage of components used to authenticate communications between drones or between a drone and a base station. For example, the TEE 128 may store SSL certificates or other security tokens. The data stored in the TEE 128 may be read-only data such that during operation the data cannot be corrupted or otherwise altered by malware or viruses.

The computing environment 108 may include a central processing unit (CPU) 148, a video/graphics card 150, a battery 152, a communications interface 154, and a memory 156. The CPU 148 may be used to execute operations, such as those described herein. The video/graphics card 150 may be used to process images or video captured by the camera 116. The memory 156 may store data received by the drone 100 as well as programs and other software utilized by the drone 100. For example, the memory 156 may store instructions that, when executed by the CPU 148, cause the CPU 148 to perform operations such as those described herein.

The battery 152 may provide power to the drone 100. In addition, the battery 152 may be used to power the power harvesting mechanism 104. While FIG. 1 shows a single battery, more than one battery may be utilized with drone 100. While FIG. 1 shows various components of the drone 100, not all components shown in FIG. 1 are required. More or fewer components may be used on a drone 100 according to the design and use requirements of the drone 100.

Figure 2:
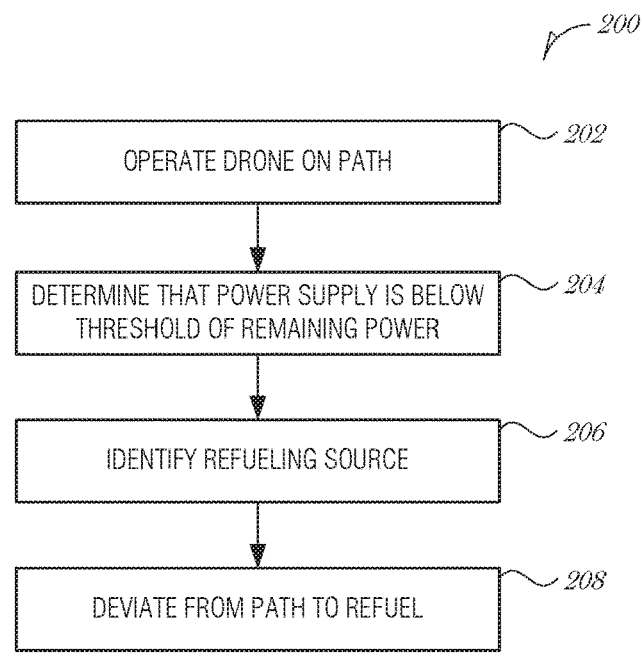
FIG. 2 is a block diagram illustrating data and control flow of drone deployment, according to an embodiment.

FIG. 2 is a block diagram illustrating data and control flow of drone deployment 200, according to an embodiment. The drone may be a power harvesting drone that is capable of finding a power source while deployed and refueling using the power source. At block 202, the power harvesting drone is operated to navigate a predetermined path. The predetermined path may be used to navigate the drone to a point where a certain task is to be performed (e.g., to deliver a package), or may be a path that the drone is to patrol during security surveillance, for example. The path may be calculated at the time of initial deployment, before the drone launches. Alternatively, the path may be recalculated periodically or regularly during deployment. The path may be provided by a user (e.g., drone operator), a navigation service, a drone control service, or other entity, or may be generated using onboard telemetry and avionics controls.

The drone may be an unmanned aerial vehicle (UAV), in which case it includes one or more flight mechanisms and corresponding control systems. The drone may alternatively be a terrestrial drone, in which case it may include various wheels, tracks, legs, or other mechanisms to traverse over land. Thus, in an embodiment, the power harvesting drone includes a locomotion mechanism (e.g., motor assembly), the locomotion mechanism including a flight mechanism. In another embodiment, the power harvesting drone includes a locomotion mechanism, the locomotion mechanism including a terrestrial mechanism. The drone may also be an aquatic drone, in which case it may use one of several types of marine propulsion mechanisms, such as a prop (propeller), jet drive, paddle wheel, whale-tail propulsion, or other type of propulsor. Thus, in another embodiment, the locomotion mechanism includes a marine propulsion mechanism.

The drone may be semi- or fully-autonomous. Thus, in an embodiment, operating the power harvesting drone includes operating the power harvesting drone in an autonomous mode.

At block 204, it is determined that a power supply used to operate the power harvesting drone is below a threshold of remaining power. In an embodiment, the threshold of remaining power is an amount of remaining power that is enough for the power harvesting drone to complete navigating the predetermined path. The path may be a round trip path that navigates the drone to a destination (e.g., a point of delivery) and then back to an origin (e.g., a drone garage). As such, the predetermined path may be an out-and-back path. It is understood that a delivery drone may have one or more stops in the delivery path and that the predetermined path in this case may include several legs.

The predetermined path may be defined using an area, for example, a corridor that the drone is to travel. While travelling in the corridor the drone may wander. The wandering may be due to wind, operational variances, or by navigation design. For instance, the drone may move from point to point in a random or semi-random fashion while patrolling a security perimeter. Such randomness may make the drone more effective at surprising trespassers by being unpredictable. Thus, the predetermined pay may be defined using an area (e.g., zone of operation, corridor of operation, etc.) or by hops between random waypoints.

In an embodiment, the threshold of remaining power is configurable. For example, remaining power may be represented as an amount of battery life remaining (e.g., 10% battery power remaining), and a user may configure the threshold as being 25%, such that when the battery level indicates approximately 25% of battery life remaining, the drone begins to seek out opportunistic refueling sources (e.g., energy sources). The remaining power may also be represented as a value of remaining battery capacity in milliamp Hours (mAh) or by an amount of operating time remaining (e.g., 12 minutes of flight remaining).

In an embodiment, the threshold of remaining power is an amount of remaining power that is enough for the power harvesting drone to complete navigating the predetermined path with a reserve. The reserve may be configurable. The reserve provides an additional buffer of operation for safety considerations and to account for unforeseen or unaccounted for aspects of operation.

At block 206, an opportunistic refueling source is identified. In an embodiment, identifying the opportunistic refueling source includes communicating with a server and receiving from the server a set of opportunistic refueling sources. A server may provide the locations, features, and other aspects of various potential power sources. Querying the server allows the drone to quickly identify one or more potential power sources in range of the drone. The server may filter the set of opportunistic refueling sources based on the type of drone, the functionality available on the drone, the distance from the drone to each power source, etc. Additionally, the server may act as a proxy with an owner of the power source. For instance, the opportunistic refueling source may be an electrical power line owned by a local power company. The drone may have to provide payment to the power company in order to legally siphon some electricity from the power line. Service contracts may be in place to accommodate such arrangements. Other opportunistic refueling sources may be public property (e.g., a river), or may be unregulated (e.g., harvesting waste heat from a smokestack).

In an embodiment, identifying the opportunistic refueling source includes communicating with another drone and receiving from the drone a set of opportunistic refueling sources. Drones may maintain an internal reference of potential power sources. For instance, a drone may be provided a map of opportunistic refueling sources in their duty area. Drones from different companies may have different maps. Drones may communicate with each other to share opportunistic refueling sources. For instance, a drone that is low on battery power may broadcast a call for assistance. Nearby drones may answer with one or more opportunistic refueling sources. The broadcast may include the drone identifier, owner, type of opportunistic refueling sources supported on the drone, urgency level, and other aspects. The responses may include the type of opportunistic refueling source, geo-coordinates, licensing requirements, and the like.

In an embodiment, the set of opportunistic refueling sources is ranked. Ranking may be by any of a number of features of the opportunistic refueling source. In an embodiment, the set of opportunistic refueling sources is ranked by distance away from the power harvesting drone. In another embodiment, the set of opportunistic refueling sources is ranked by a cost to refuel.

In another embodiment, the set of opportunistic refueling sources is ranked by bid offers provided by the providers of the set of opportunistic refueling sources. In this embodiment, owners of opportunistic refueling source may participate in a marketplace of opportunistic refueling sources and provide a cost to refuel. This is similar to how gas stations work in an open marketplace. Bid offers may be particular to the drone based on how much power the drone may siphon, the type of drone, the number of drones already using the opportunistic refueling source, agreements with the drone's provider, and other aspects.

In an embodiment, identifying the opportunistic refueling source includes surveying an area around the power harvesting drone using a sensor array on the power harvesting drone and identifying the opportunistic refueling source based on the survey. When the drone becomes aware that it needs to seek out an opportunistic refueling source, the drone may begin image capture and analysis, for example, using onboard cameras. Thus, in an embodiment, the sensor array includes a camera, and wherein surveying the area includes performing an image analysis to identify the opportunistic refueling source.

The drone may perform various types of image analysis, such as infrared image analysis to identify heat sources, object recognition to identify power lines, or the like. In an embodiment, performing the image analysis includes performing an infrared image analysis to identify a heat source associated with the opportunistic refueling source.

At block 208, the predetermined flight path is deviated from to refuel at least a portion of the power supply from the opportunistic refueling source using a refueling mechanism onboard the power harvesting drone. The refueling mechanism is an energy replenishment couple arranged to engage (e.g., interface) with an energy source and provide energy to the drone. Example energy couplers may include a fuel container and entry port, a wire, a solar cell, etc. In an embodiment, deviating from the predetermined path to refuel at least a portion of the power supply from the opportunistic refueling source includes identifying a motor vehicle traveling in a direction compatible with the path and navigating to the motor vehicle. The power harvesting drone may be caused to couple with the motor vehicle and then decouple from the motor vehicle, after which the drone is able to resume the predetermined path. This type of path deviation provides the benefit of power conservation. While on the motor vehicle, the power harvesting drone may be caused to refuel while coupled to the vehicle. In an embodiment, to refuel, the power harvesting drone is to implement a wind generator to refuel a battery on the power harvesting drone. In an embodiment, to refuel, the power harvesting drone is to implement a vibration-powered generator to refuel a battery on the power harvesting drone.

The wind and vibration-powered generators may be active while the drone is not on the moving motor vehicle. For instance, while the drone is moving about during its duty cycle, a wind generator, vibration-powered generator, or other type of energy harvesting mechanism, may be active so that the battery drain is offset by some power harvesting.

In an embodiment, the opportunistic refueling source comprises a power line. The drone may identify a power line and then couple to the power line to refuel or recharge a battery. The drone may use an arm that is attached to the drone, the arm including an inductive clamp or other apparatus to inductively charge from the power line. Thus, in an embodiment, the refueling mechanism comprises an inductive coupling device.

In another embodiment, the opportunistic refueling source comprises a water way. In this type of situation, the refueling mechanism may include a hydro turbine. The drone may be configured to land near the water way and place the hydro turbine in the water to harvest power.

In an embodiment, the opportunistic refueling source comprises a moving vehicle. In the moving vehicle context, several advantages are available to the drone. For instance, the drone may be able to hitch a ride on the vehicle to traverse roughly toward a destination or waypoint on the predetermined path of the drone. This saves the drone from having to move to the destination or waypoint on its own power. Additionally, the moving vehicle may provide the drone with opportunities to refuel or recharge in one or more ways. In an embodiment, the refueling mechanism comprises a vibration-powered generator. As the vehicle moves over the road, for example, the drone may convert vibration or other movements into electrical energy to recharge a battery. The vehicle may also be a source of thermal energy, which may be converted to electrical energy. The drone may also be able to harvest power from a wind generator while riding on the moving vehicle.

In an embodiment, the opportunistic refueling source comprises a thermal source. The thermal source may be a vehicle, an electric transformer, a smokestack, etc. In such an embodiment, the refueling mechanism comprises a thermoelectric generator.

Figure 3:
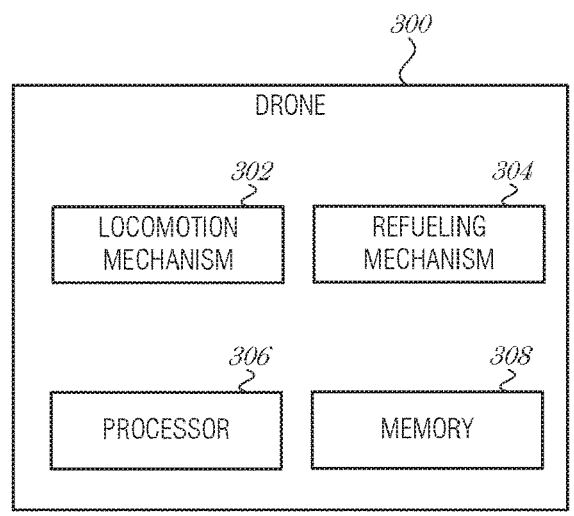
FIG. 3 is a block diagram illustrating a power harvesting drone, according to an embodiment.

FIG. 3 is a block diagram illustrating a power harvesting drone 300, according to an embodiment. The drone 300 includes a locomotion mechanism 302, a refueling mechanism 304, a processor 306 communicatively coupled to the flight mechanism and the refueling mechanism, and a memory 308 storing instructions. The instructions, which when executed by the processor cause the processor to: operate the power harvesting drone to navigate a predetermined path, determine that a power supply used to operate the power harvesting drone is below a threshold of remaining power, identify an opportunistic refueling source, and deviate from the predetermined path to refuel at least a portion of the power supply from the opportunistic refueling source using a refueling mechanism onboard the power harvesting drone.

In an embodiment, the locomotion mechanism 302 includes a flight mechanism. In an embodiment, the locomotion mechanism 302 includes a terrestrial mechanism.

In an embodiment, wherein to operate the power harvesting drone, the processor 306 is to operate the power harvesting drone 300 in an autonomous mode.

In an embodiment, the threshold of remaining power is an amount of remaining power that is enough for the power harvesting drone 300 to complete navigating the predetermined path. In a further embodiment, the threshold of remaining power is configurable. In a related embodiment, the threshold of remaining power is an amount of remaining power that is enough for the power harvesting drone 300 to complete navigating the predetermined path with a reserve. In a further embodiment, the reserve is configurable.

In an embodiment, to identify the opportunistic refueling source, the processor 306 is to communicate with a server and receive from the server a set of opportunistic refueling sources.

In an embodiment, to identify the opportunistic refueling source, the processor is to communicate with another drone and receive from the drone a set of opportunistic refueling sources.

In an embodiment, the set of opportunistic refueling sources is ranked. In a related embodiment, the set of opportunistic refueling sources is ranked by distance away from the power harvesting drone. In a related embodiment, the set of opportunistic refueling sources is ranked by a cost to refuel. In a related embodiment, the set of opportunistic refueling sources is ranked by bid offers provided by the providers of the set of opportunistic refueling sources.

In an embodiment, to identify the opportunistic refueling source, the processor 306 is to survey an area around the power harvesting drone 300 using a sensor array on the power harvesting drone 300 and identify the opportunistic refueling source based on the survey. In a further embodiment, the sensor array includes a camera, and wherein to survey the area, the processor 306 is to perform an image analysis to identify the opportunistic refueling source. In a related embodiment, to perform the image analysis, the processor 306 is to perform an infrared image analysis to identify a heat source associated with the opportunistic refueling source.

In an embodiment, wherein the opportunistic refueling source comprises a power line. In a further embodiment, the refueling mechanism comprises an inductive coupling device.

In an embodiment, the opportunistic refueling source comprises a water way. In a further embodiment, the refueling mechanism comprises a hydro turbine.

In an embodiment, the opportunistic refueling source comprises a moving vehicle. In a further embodiment, the refueling mechanism comprises a vibration-powered generator.

In an embodiment, the opportunistic refueling source comprises a thermal source. In a further embodiment, the refueling mechanism comprises a thermoelectric generator.

In an embodiment, to deviate from the predetermined path to refuel at least a portion of the power supply from the opportunistic refueling source, the processor 306 is to identify a motor vehicle traveling in a direction compatible with the path, navigate to the motor vehicle, cause the power harvesting drone to couple with the motor vehicle, cause the power harvesting drone to decouple from the motor vehicle, and resume the predetermined path. In a further embodiment, the processor 306 is to cause the power harvesting drone to refuel while coupled to the vehicle. In a further embodiment, to refuel, the power harvesting drone 300 is to implement a wind generator to refuel a battery on the power harvesting drone 300. In a related embodiment, to refuel, the power harvesting drone 300 is to implement a vibration-powered generator to refuel a battery on the power harvesting drone 300.

Embodiments may be implemented in one or a combination of hardware, firmware, and software. Embodiments may also be implemented as instructions stored on a machine-readable storage device, which may be read and executed by at least one processor to perform the operations described herein. A machine-readable storage device may include any non-transitory mechanism for storing information in a form readable by a machine (e.g., a computer). For example, a machine-readable storage device may include read-only memory (ROM), random-access memory (RAM), magnetic disk storage media, optical storage media, flash-memory devices, and other storage devices and media.

A processor subsystem may be used to execute the instruction on the machine-readable medium. The processor subsystem may include one or more processors, each with one or more cores. Additionally, the processor subsystem may be disposed on one or more physical devices. The processor subsystem may include one or more specialized processors, such as a graphics processing unit (GPU), a digital signal processor (DSP), a field programmable gate array (FPGA), or a fixed function processor.

Examples, as described herein, may include, or may operate on, logic or a number of components, modules, or mechanisms. Modules may be hardware, software, or firmware communicatively coupled to one or more processors in order to carry out the operations described herein. Modules may be hardware modules, and as such modules may be considered tangible entities capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine-readable medium. In an example, the software, when executed by the underlying hardware of the module, causes the hardware to perform the specified operations. Accordingly, the term hardware module is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software; the general-purpose hardware processor may be configured as respective different modules at different times. Software may accordingly configure a hardware processor, for example, to constitute a particular module at one instance of time and to constitute a different module at a different instance of time. Modules may also be software or firmware modules, which operate to perform the methodologies described herein.

Circuitry or circuits, as used in this document, may comprise, for example, singly or in any combination, hardwired circuitry, programmable circuitry such as computer processors comprising one or more individual instruction processing cores, state machine circuitry, and/or firmware that stores instructions executed by programmable circuitry. The circuits, circuitry, or modules may, collectively or individually, be embodied as circuitry that forms part of a larger system, for example, an integrated circuit (IC), system on-chip (SoC), desktop computers, laptop computers, tablet computers, servers, smart phones, etc.

Figure 4:
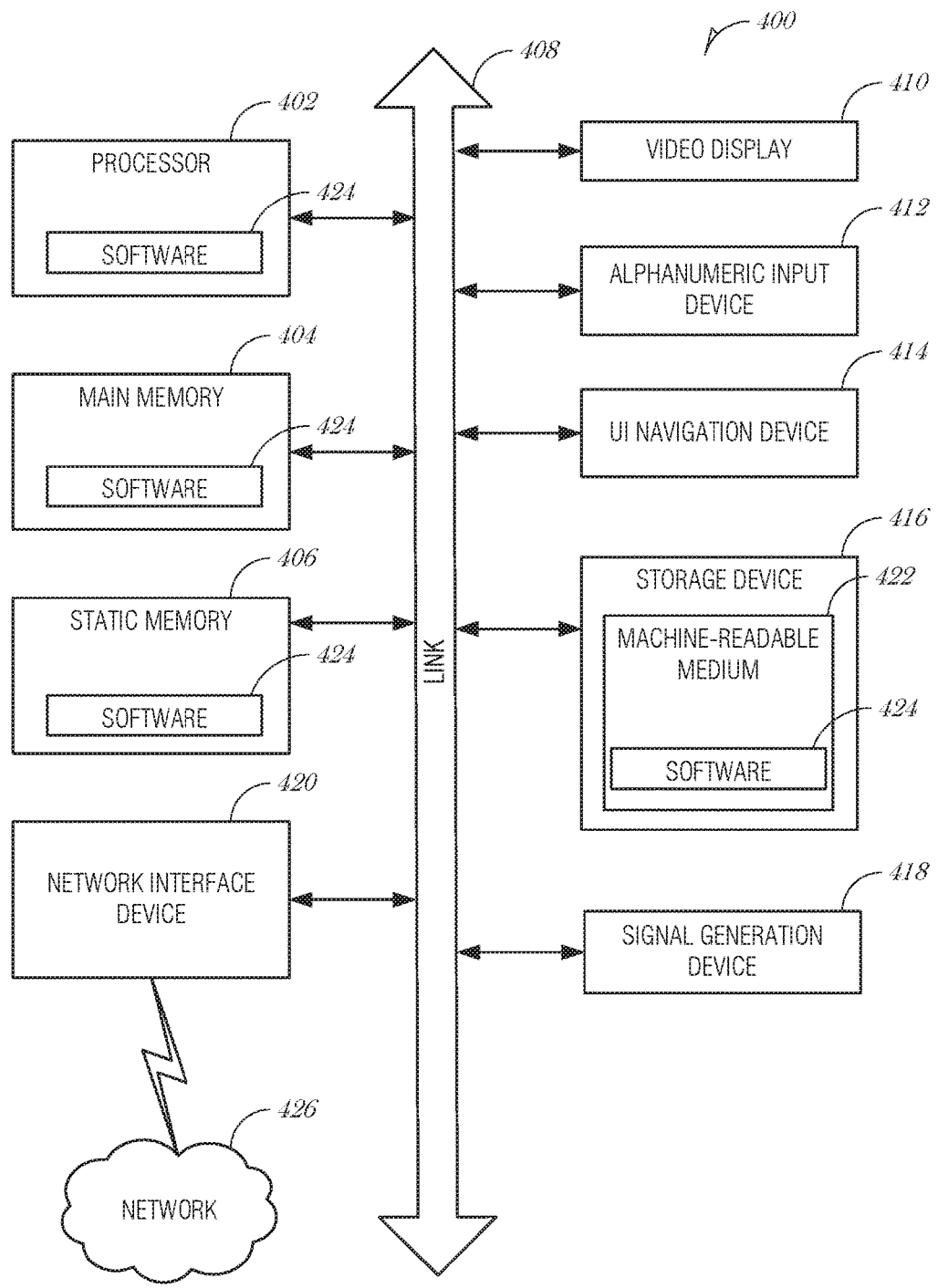
FIG. 4 is a block diagram illustrating an example machine upon which any one or more of the techniques (e.g., methodologies) discussed herein may perform, according to an example embodiment.

FIG. 4 is a block diagram illustrating a machine in the example form of a computer system 400, within which a set or sequence of instructions may be executed to cause the machine to perform any one of the methodologies discussed herein, according to an example embodiment. In alternative embodiments, the machine operates as a standalone device or may be connected (e.g., networked) to other machines. In a networked deployment, the machine may operate in the capacity of either a server or a client machine in server-client network environments, or it may act as a peer machine in peer-to-peer (or distributed) network environments. The machine may be a drone, wearable device, personal computer (PC), a tablet PC, a hybrid tablet, a personal digital assistant (PDA), a mobile telephone, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein. Similarly, the term "processor-based system" shall be taken to include any set of one or more machines that are controlled by or operated by a processor (e.g., a computer) to individually or jointly execute instructions to perform any one or more of the methodologies discussed herein.

Example computer system 400 includes at least one processor 402 (e.g., a central processing unit (CPU), a graphics processing unit (GPU) or both, processor cores, compute nodes, etc.), a main memory 404 and a static memory 406, which communicate with each other via a link 408 (e.g., bus). The computer system 400 may optionally further include a video display unit 410, an alphanumeric input device 412 (e.g., a keyboard), and a user interface (UI) navigation device 414 (e.g., a mouse). In an embodiment, the video display unit 410, input device 412 and UI navigation device 414 are incorporated into a touch screen display. The computer system 400 may additionally include a storage device 416 (e.g., a drive unit), a signal generation device 418 (e.g., a speaker), a network interface device 420, and one or more sensors (not shown), such as a global positioning system (GPS) sensor, compass, accelerometer, gyrometer, magnetometer, camera, or other sensor.

The storage device 416 includes a machine-readable medium 422 on which is stored one or more sets of data structures and instructions 424 (e.g., software) embodying or utilized by any one or more of the methodologies or functions described herein. The instructions 424 may also reside, completely or at least partially, within the main memory 404, static memory 406, and/or within the processor 402 during execution thereof by the computer system 400, with the main memory 404, static memory 406, and the processor 402 also constituting machine-readable media.

While the machine-readable medium 422 is illustrated in an example embodiment to be a single medium, the term "machine-readable medium" may include a single medium or multiple media (e.g., a centralized or distributed database, and/or associated caches and servers) that store the one or more instructions 424. The term "machine-readable medium" shall also be taken to include any tangible medium that is capable of storing, encoding or carrying instructions for execution by the machine and that cause the machine to perform any one or more of the methodologies of the present disclosure or that is capable of storing, encoding or carrying data structures utilized by or associated with such instructions. The term "machine-readable medium" shall accordingly be taken to include, but not be limited to, solid-state memories, and optical and magnetic media. Specific examples of machine-readable media include non-volatile memory, including but not limited to, by way of example, semiconductor memory devices (e.g., electrically programmable read-only memory (EPROM), electrically erasable programmable read-only memory (EEPROM)) and flash memory devices; magnetic disks such as internal hard disks and removable disks; magneto-optical disks, and CD-ROM and DVD-ROM disks.

The instructions 424 may further be transmitted or received over a communications network 426 using a transmission medium via the network interface device 420 utilizing any one of a number of well-known transfer protocols (e.g., HTTP). Examples of communication networks include a local area network (LAN), a wide area network (WAN), the Internet, mobile telephone networks, plain old telephone (POTS) networks, and wireless data networks (e.g., Bluetooth, Wi-Fi, 3G. and 4G LTE/LTE-A or WiMAX networks). The term "transmission medium" shall be taken to include any intangible medium that is capable of storing, encoding, or carrying instructions for execution by the machine, and includes digital or analog communications signals or other intangible medium to facilitate communication of such software.

ADDITIONAL NOTES & EXAMPLES

Example 1 is a power harvesting drone, comprising: a motor assembly; an energy replenishment coupler; a processor communicatively coupled to the energy replenishment coupler; and memory storing instructions that, when executed by the processor, cause the processor to: operate the power harvesting drone to navigate a predetermined path; determine that a power supply used to operate the power harvesting drone is below a threshold of remaining power; identify an opportunistic energy source; and deviate from the predetermined path to replenish at least a portion of the power supply from the opportunistic energy source using the energy replenishment coupler onboard the power harvesting drone.

In Example 2, the subject matter of Example 1 optionally includes wherein the motor assembly includes a flight mechanism.

In Example 3, the subject matter of any one or more of Examples 1-2 optionally include wherein the motor assembly includes a terrestrial mechanism.

In Example 4, the subject matter of any one or more of Examples 1-3 optionally include wherein the motor assembly including a marine propulsion mechanism.

In Example 5, the subject matter of any one or more of Examples 1-4 optionally include wherein to operate the power harvesting drone, the processor is to operate the power harvesting drone in an autonomous mode.

In Example 6, the subject matter of any one or more of Examples 1-5 optionally include wherein the threshold of remaining power is an amount of remaining power that is enough for the power harvesting drone to complete navigating the predetermined path.

In Example 7, the subject matter of Example 6 optionally includes wherein the threshold of remaining power is configurable.

In Example 8, the subject matter of any one or more of Examples 6-7 optionally include wherein the threshold of remaining power is an amount of remaining power that is enough for the power harvesting drone to complete navigating the predetermined path with a reserve.

In Example 9, the subject matter of Example 8 optionally includes wherein the reserve is configurable.

In Example 10, the subject matter of any one or more of Examples 1-9 optionally include wherein to identify the opportunistic energy source, the processor is to: communicate with a server; and receive from the server a set of opportunistic energy sources.

In Example 11, the subject matter of any one or more of Examples 1-10 optionally include wherein to identify the opportunistic energy source, the processor is to: communicate with another drone; and receive from the drone a set of opportunistic energy sources.

In Example 12, the subject matter of Example 11 optionally includes wherein the set of opportunistic energy sources is ranked.

In Example 13, the subject matter of Example 12 optionally includes wherein the set of opportunistic energy sources is ranked by distance away from the power harvesting drone.

In Example 14, the subject matter of any one or more of Examples 12-13 optionally include wherein the set of opportunistic energy sources is ranked by a cost to replenish the power supply.

In Example 15, the subject matter of any one or more of Examples 12-14 optionally include wherein the set of opportunistic energy sources is ranked by bid offers provided by the providers of the set of opportunistic energy sources.

In Example 16, the subject matter of any one or more of Examples 1-15 optionally include wherein to identify the opportunistic energy source, the processor is to: survey an area around the power harvesting drone using a sensor array on the power harvesting drone; and identify the opportunistic energy source based on the survey.

In Example 17, the subject matter of Example 16 optionally includes wherein the sensor array includes a camera, and wherein to survey the area, the processor is to: perform an image analysis to identify the opportunistic energy source.

In Example 18, the subject matter of Example 17 optionally includes wherein to perform the image analysis, the processor is to perform an infrared image analysis to identify a heat source associated with the opportunistic energy source.

In Example 19, the subject matter of any one or more of Examples 1-18 optionally include wherein the opportunistic energy source comprises a power line.

In Example 20, the subject matter of Example 19 optionally includes wherein the energy replenishment coupler comprises an inductive coupling device.

In Example 21, the subject matter of any one or more of Examples 1-20 optionally include wherein the opportunistic energy source comprises a water way.

In Example 22, the subject matter of Example 21 optionally includes wherein the energy replenishment coupler comprises a hydro turbine.

In Example 23, the subject matter of any one or more of Examples 1-22 optionally include wherein the opportunistic energy source comprises a moving vehicle.

In Example 24, the subject matter of Example 23 optionally includes wherein the energy replenishment coupler comprises a vibration-powered generator.

In Example 25, the subject matter of any one or more of Examples 23-24 optionally include wherein the energy replenishment coupler comprises a wind generator.

In Example 26, the subject matter of any one or more of Examples 23-25 optionally include wherein the energy replenishment coupler comprises a thermoelectric generator.

In Example 27, the subject matter of any one or more of Examples 1-26 optionally include wherein the opportunistic energy source comprises a thermal source.

In Example 28, the subject matter of Example 27 optionally includes wherein the energy replenishment coupler comprises a thermoelectric generator.

In Example 29, the subject matter of any one or more of Examples 1-28 optionally include wherein to deviate from the predetermined path to replenish at least a portion of the power supply from the opportunistic energy source, the processor is to: identify a motor vehicle traveling in a direction compatible with the path; navigate to the motor vehicle; cause the power harvesting drone to couple with the motor vehicle; cause the power harvesting drone to decouple from the motor vehicle; and resume the predetermined path.

In Example 30, the subject matter of Example 29 optionally includes wherein the processor is to: cause the power harvesting drone to replenish the power supply while coupled to the vehicle.

In Example 31, the subject matter of Example 30 optionally includes wherein to replenish the power supply, the power harvesting drone is to implement a wind generator to replenish a battery on the power harvesting drone.

In Example 32, the subject matter of any one or more of Examples 30-31 optionally include wherein to replenish the power supply, the power harvesting drone is to implement a vibration-powered generator to replenish a battery on the power harvesting drone.

In Example 33, the subject matter of any one or more of Examples 30-32 optionally include wherein to replenish the power supply, the power harvesting drone is to implement a thermoelectric generator to replenish a battery on the power harvesting drone.

Example 34 is a method of deploying a power harvesting drone, the method comprising: operating the power harvesting drone to navigate a predetermined path; determining that a power supply used to operate the power harvesting drone is below a threshold of remaining power; identifying an opportunistic energy source; and deviating from the predetermined flight path to replenish at least a portion of the power supply from the opportunistic energy source using an energy replenishment coupler onboard the power harvesting drone.

In Example 35, the subject matter of Example 34 optionally includes wherein the power harvesting drone includes a motor assembly, the motor assembly including a flight mechanism.

In Example 36, the subject matter of any one or more of Examples 34-35 optionally include wherein the power harvesting drone includes a motor assembly, the motor assembly including a terrestrial mechanism.

In Example 37, the subject matter of any one or more of Examples 34-36 optionally include wherein the power harvesting drone includes a motor assembly, the motor assembly including a marine propulsion mechanism.

In Example 38, the subject matter of any one or more of Examples 34-37 optionally include wherein operating the power harvesting drone includes operating the power harvesting drone in an autonomous mode.

In Example 39, the subject matter of any one or more of Examples 34-38 optionally include wherein the threshold of remaining power is an amount of remaining power that is enough for the power harvesting drone to complete navigating the predetermined path.

In Example 40, the subject matter of Example 39 optionally includes wherein the threshold of remaining power is configurable.

In Example 41, the subject matter of any one or more of Examples 39-40 optionally include wherein the threshold of remaining power is an amount of remaining power that is enough for the power harvesting drone to complete navigating the predetermined path with a reserve.

In Example 42, the subject matter of Example 41 optionally includes wherein the reserve is configurable.

In Example 43, the subject matter of any one or more of Examples 34-42 optionally include wherein identifying the opportunistic energy source includes: communicating with a server; and receiving from the server a set of opportunistic energy sources.

In Example 44, the subject matter of any one or more of Examples 34-43 optionally include wherein identifying the opportunistic energy source includes: communicating with another drone; and receiving from the drone a set of opportunistic energy sources.

In Example 45, the subject matter of any one or more of Examples 43-44 optionally include wherein the set of opportunistic energy sources is ranked.

In Example 46, the subject matter of Example 45 optionally includes wherein the set of opportunistic energy sources is ranked by distance away from the power harvesting drone.

In Example 47, the subject matter of any one or more of Examples 45-46 optionally include wherein the set of opportunistic energy sources is ranked by a cost to replenish the power supply.

In Example 48, the subject matter of any one or more of Examples 45-47 optionally include wherein the set of opportunistic energy sources is ranked by bid offers provided by the providers of the set of opportunistic energy sources.

In Example 49, the subject matter of any one or more of Examples 34-48 optionally include wherein identifying the opportunistic energy source includes: surveying an area around the power harvesting drone using a sensor array on the power harvesting drone; and identifying the opportunistic energy source based on the survey.

In Example 50, the subject matter of Example 49 optionally includes wherein the sensor array includes a camera, and wherein surveying the area includes: performing an image analysis to identify the opportunistic energy source.

In Example 51, the subject matter of Example 50 optionally includes wherein performing the image analysis includes performing an infrared image analysis to identify a heat source associated with the opportunistic energy source.

In Example 52, the subject matter of any one or more of Examples 34-51 optionally include wherein the opportunistic energy source comprises a power line.

In Example 53, the subject matter of Example 52 optionally includes wherein the energy replenishment coupler comprises an inductive coupling device.

In Example 54, the subject matter of any one or more of Examples 34-53 optionally include wherein the opportunistic energy source comprises a water way.

In Example 55, the subject matter of Example 54 optionally includes wherein the energy replenishment coupler comprises a hydro turbine.

In Example 56, the subject matter of any one or more of Examples 34-55 optionally include wherein the opportunistic energy source comprises a moving vehicle.

In Example 57, the subject matter of Example 56 optionally includes wherein the energy replenishment coupler comprises a vibration-powered generator.

In Example 58, the subject matter of any one or more of Examples 56-57 optionally include wherein the energy replenishment coupler comprises a wind generator.

In Example 59, the subject matter of any one or more of Examples 56-58 optionally include wherein the energy replenishment coupler comprises a thermoelectric generator.

In Example 60, the subject matter of any one or more of Examples 34-59 optionally include wherein the opportunistic energy source comprises a thermal source.

In Example 61, the subject matter of Example 60 optionally includes wherein the energy replenishment coupler comprises a thermoelectric generator.

In Example 62, the subject matter of any one or more of Examples 34-61 optionally include wherein deviating from the predetermined path to replenish at least a portion of the power supply from the opportunistic energy source includes: identifying a motor vehicle traveling in a direction compatible with the path; navigating to the motor vehicle; causing the power harvesting drone to couple with the motor vehicle; causing the power harvesting drone to decouple from the motor vehicle; and resuming the predetermined path.

In Example 63, the subject matter of Example 62 optionally includes causing the power harvesting drone to replenish the power supply while coupled to the vehicle.

In Example 64, the subject matter of Example 63 optionally includes wherein to replenish the power supply, the power harvesting drone is to implement a wind generator to replenish a battery on the power harvesting drone.

In Example 65, the subject matter of any one or more of Examples 63-64 optionally include wherein to replenish the power supply, the power harvesting drone is to implement a vibration-powered generator to replenish a battery on the power harvesting drone.

In Example 66, the subject matter of any one or more of Examples 63-65 optionally include wherein to replenish the power supply, the power harvesting drone is to implement a thermoelectric generator to replenish a battery on the power harvesting drone.

Example 67 is at least one machine-readable medium including instructions, which when executed by a machine, cause the machine to perform operations of any of the methods of Examples 34-66.

Example 68 is an apparatus comprising means for performing any of the methods of Examples 34-66.

Example 69 is an apparatus for deploying a power harvesting drone, the apparatus comprising: means for operating the power harvesting drone to navigate a predetermined path; means for determining that a power supply used to operate the power harvesting drone is below a threshold of remaining power; means for identifying an opportunistic energy source; and means for deviating from the predetermined flight path to replenish at least a portion of the power supply from the opportunistic energy source using an energy replenishment coupler onboard the power harvesting drone.

In Example 70, the subject matter of Example 69 optionally includes wherein the power harvesting drone includes a motor assembly, the motor assembly including a flight mechanism.

In Example 71, the subject matter of any one or more of Examples 69-70 optionally include wherein the power harvesting drone includes a motor assembly, the motor assembly including a terrestrial mechanism.

In Example 72, the subject matter of any one or more of Examples 69-71 optionally include wherein the power harvesting drone includes a motor assembly, the motor assembly including a marine propulsion mechanism.

In Example 73, the subject matter of any one or more of Examples 69-72 optionally include wherein the means for operating the power harvesting drone include means for operating the power harvesting drone in an autonomous mode.

In Example 74, the subject matter of any one or more of Examples 69-73 optionally include wherein the threshold of remaining power is an amount of remaining power that is enough for the power harvesting drone to complete navigating the predetermined path.

In Example 75, the subject matter of Example 74 optionally includes wherein the threshold of remaining power is configurable.

In Example 76, the subject matter of any one or more of Examples 74-75 optionally include wherein the threshold of remaining power is an amount of remaining power that is enough for the power harvesting drone to complete navigating the predetermined path with a reserve.

In Example 77, the subject matter of Example 76 optionally includes wherein the reserve is configurable.

In Example 78, the subject matter of any one or more of Examples 69-77 optionally include wherein the means for identifying the opportunistic energy source include: means for communicating with a server; and means for receiving from the server a set of opportunistic energy sources.

In Example 79, the subject matter of any one or more of Examples 69-78 optionally include wherein the means for identifying the opportunistic energy source include: means for communicating with another drone; and means for receiving from the drone a set of opportunistic energy sources.

In Example 80, the subject matter of any one or more of Examples 78-79 optionally include wherein the set of opportunistic energy sources is ranked.

In Example 81, the subject matter of Example 80 optionally includes wherein the set of opportunistic energy sources is ranked by distance away from the power harvesting drone.

In Example 82, the subject matter of any one or more of Examples 80-81 optionally include wherein the set of opportunistic energy sources is ranked by a cost to replenish the power supply.

In Example 83, the subject matter of any one or more of Examples 80-82 optionally include wherein the set of opportunistic energy sources is ranked by bid offers provided by the providers of the set of opportunistic energy sources.

In Example 84, the subject matter of any one or more of Examples 69-83 optionally include wherein the means for identifying the opportunistic energy source include: means for surveying an area around the power harvesting drone using a sensor array on the power harvesting drone; and means for identifying the opportunistic energy source based on the survey.

In Example 85, the subject matter of Example 84 optionally includes wherein the sensor array includes a camera, and wherein the means for surveying the area include: means for performing an image analysis to identify the opportunistic energy source.

In Example 86, the subject matter of Example 85 optionally includes wherein the means for performing the image analysis include means for performing an infrared image analysis to identify a heat source associated with the opportunistic energy source.

In Example 87, the subject matter of any one or more of Examples 69-86 optionally include wherein the opportunistic energy source comprises a power line.

In Example 88, the subject matter of Example 87 optionally includes wherein the energy replenishment coupler comprises an inductive coupling device.

In Example 89, the subject matter of any one or more of Examples 69-88 optionally include wherein the opportunistic energy source comprises a water way.

In Example 90, the subject matter of Example 89 optionally includes wherein the energy replenishment coupler comprises a hydro turbine.

In Example 91, the subject matter of any one or more of Examples 69-90 optionally include wherein the opportunistic energy source comprises a moving vehicle.

In Example 92, the subject matter of Example 91 optionally includes wherein the energy replenishment coupler comprises a vibration-powered generator.

In Example 93, the subject matter of any one or more of Examples 91-92 optionally include wherein the energy replenishment coupler comprises a wind generator.

In Example 94, the subject matter of any one or more of Examples 91-93 optionally include wherein the energy replenishment coupler comprises a thermoelectric generator.

In Example 95, the subject matter of any one or more of Examples 69-94 optionally include wherein the opportunistic energy source comprises a thermal source.

In Example 96, the subject matter of Example 95 optionally includes wherein the energy replenishment coupler comprises a thermoelectric generator.

In Example 97, the subject matter of any one or more of Examples 69-96 optionally include wherein the means for deviating from the predetermined path to replenish at least a portion of the power supply from the opportunistic energy source include: means for identifying a motor vehicle traveling in a direction compatible with the path; means for navigating to the motor vehicle; means for causing the power harvesting drone to couple with the motor vehicle; means for causing the power harvesting drone to decouple from the motor vehicle; and means for resuming the predetermined path.

In Example 98, the subject matter of Example 97 optionally includes means for causing the power harvesting drone to replenish the power supply while coupled to the vehicle.

In Example 99, the subject matter of Example 98 optionally includes wherein to replenish the power supply, the power harvesting drone is to implement a wind generator to replenish a battery on the power harvesting drone.

In Example 100, the subject matter of any one or more of Examples 98-99 optionally include wherein to replenish the power supply, the power harvesting drone is to implement a vibration-powered generator to replenish a battery on the power harvesting drone.

In Example 101, the subject matter of any one or more of Examples 98-100 optionally include wherein to replenish the power supply, the power harvesting drone is to implement a thermoelectric generator to replenish a battery on the power harvesting drone.

Example 102 is at least one machine-readable medium including instructions for deploying a power harvesting drone, which when executed by a machine, cause the machine to: operate the power harvesting drone to navigate a predetermined path; determine that a power supply used to operate the power harvesting drone is below a threshold of remaining power; identify an opportunistic energy source; and deviate from the predetermined flight path to replenish at least a portion of the power supply from the opportunistic energy source using an energy replenishment coupler onboard the power harvesting drone.

In Example 103, the subject matter of Example 102 optionally includes wherein the power harvesting drone includes a motor assembly, the motor assembly including a flight mechanism.

In Example 104, the subject matter of any one or more of Examples 102-103 optionally include wherein the power harvesting drone includes a motor assembly, the motor assembly including a terrestrial mechanism.

In Example 105, the subject matter of any one or more of Examples 102-104 optionally include wherein the power harvesting drone includes a motor assembly, the motor assembly including a marine propulsion mechanism.

In Example 106, the subject matter of any one or more of Examples 102-105 optionally include wherein the instructions to operate the power harvesting drone include instructions to operate the power harvesting drone in an autonomous mode.

In Example 107, the subject matter of any one or more of Examples 102-106 optionally include wherein the threshold of remaining power is an amount of remaining power that is enough for the power harvesting drone to complete navigating the predetermined path.

In Example 108, the subject matter of Example 107 optionally includes wherein the threshold of remaining power is configurable.

In Example 109, the subject matter of any one or more of Examples 107-108 optionally include wherein the threshold of remaining power is an amount of remaining power that is enough for the power harvesting drone to complete navigating the predetermined path with a reserve.

In Example 110, the subject matter of Example 109 optionally includes wherein the reserve is configurable.

In Example 111, the subject matter of any one or more of Examples 102-110 optionally include wherein the instructions to identify the opportunistic energy source include instructions to: communicate with a server; and receive from the server a set of opportunistic energy sources.

In Example 112, the subject matter of any one or more of Examples 102-111 optionally include wherein the instructions to identify the opportunistic energy source include instructions to: communicate with another drone; and receive from the drone a set of opportunistic energy sources.

In Example 113, the subject matter of any one or more of Examples 111-112 optionally include wherein the set of opportunistic energy sources is ranked.

In Example 114, the subject matter of Example 113 optionally includes wherein the set of opportunistic energy sources is ranked by distance away from the power harvesting drone.

In Example 115, the subject matter of any one or more of Examples 113-114 optionally include wherein the set of opportunistic energy sources is ranked by a cost to replenish the power supply.

In Example 116, the subject matter of any one or more of Examples 113-115 optionally include wherein the set of opportunistic energy sources is ranked by bid offers provided by the providers of the set of opportunistic energy sources.

In Example 117, the subject matter of any one or more of Examples 102-116 optionally include wherein the instructions to identify the opportunistic energy source include instructions to: survey an area around the power harvesting drone using a sensor array on the power harvesting drone; and identify the opportunistic energy source based on the survey.

In Example 118, the subject matter of Example 117 optionally includes wherein the sensor array includes a camera, and wherein surveying the area includes: performing an image analysis to identify the opportunistic energy source.

In Example 119, the subject matter of Example 118 optionally includes wherein the instructions to perform the image analysis include instructions to perform an infrared image analysis to identify a heat source associated with the opportunistic energy source.

In Example 120, the subject matter of any one or more of Examples 102-119 optionally include wherein the opportunistic energy source comprises a power line.

In Example 121, the subject matter of Example 120 optionally includes wherein the energy replenishment coupler comprises an inductive coupling device.

In Example 122, the subject matter of any one or more of Examples 102-121 optionally include wherein the opportunistic energy source comprises a water way.

In Example 123, the subject matter of Example 122 optionally includes wherein the energy replenishment coupler comprises a hydro turbine.

In Example 124, the subject matter of any one or more of Examples 102-123 optionally include wherein the opportunistic energy source comprises a moving vehicle.

In Example 125, the subject matter of Example 124 optionally includes wherein the energy replenishment coupler comprises a vibration-powered generator.

In Example 126, the subject matter of any one or more of Examples 124-125 optionally include wherein the energy replenishment coupler comprises a wind generator.

In Example 127, the subject matter of any one or more of Examples 124-126 optionally include wherein the energy replenishment coupler comprises a thermoelectric generator.

In Example 128, the subject matter of any one or more of Examples 102-127 optionally include wherein the opportunistic energy source comprises a thermal source.

In Example 129, the subject matter of Example 128 optionally includes wherein the energy replenishment coupler comprises a thermoelectric generator.

In Example 130, the subject matter of any one or more of Examples 102-129 optionally include wherein the instructions to deviate from the predetermined path to replenish at least a portion of the power supply from the opportunistic energy source include instructions to: identify a motor vehicle traveling in a direction compatible with the path; navigate to the motor vehicle; cause the power harvesting drone to couple with the motor vehicle; cause the power harvesting drone to decouple from the motor vehicle; and resume the predetermined path.

In Example 131, the subject matter of Example 130 optionally includes instructions to: cause the power harvesting drone to replenish the power supply while coupled to the vehicle.

In Example 132, the subject matter of Example 131 optionally includes wherein to replenish the power supply, the power harvesting drone is to implement a wind generator to replenish a battery on the power harvesting drone.

In Example 133, the subject matter of any one or more of Examples 131-132 optionally include wherein to replenish the power supply, the power harvesting drone is to implement a vibration-powered generator to replenish a battery on the power harvesting drone.

In Example 134, the subject matter of any one or more of Examples 131-133 optionally include wherein to replenish the power supply, the power harvesting drone is to implement a thermoelectric generator to replenish a battery on the power harvesting drone.

Example 135 is at least one machine-readable medium including instructions, which when executed by a machine, cause the machine to perform operations of any of the operations of Examples 1-134.

Example 136 is an apparatus comprising means for performing any of the operations of Examples 1-134.

Example 137 is a system to perform the operations of any of the Examples 1-134.

Example 138 is a method to perform the operations of any of the Examples 1-134.

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, also contemplated are examples that include the elements shown or described. Moreover, also contemplated are examples using any combination or permutation of those elements shown or described (or one or more aspects thereof), either with respect to a particular example (or one or more aspects thereof), or with respect to other examples (or one or more aspects thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to suggest a numerical order for their objects.

The above description is intended to be illustrative, and not restrictive. For example, the above-described examples (or one or more aspects thereof) may be used in combination with others. Other embodiments may be used, such as by one of ordinary skill in the art upon reviewing the above description. The Abstract is to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. However, the claims may not set forth every feature disclosed herein as embodiments may feature a subset of said features. Further, embodiments may include fewer features than those disclosed in a particular example. Thus, the following claims are hereby incorporated into the Detailed Description, with a claim standing on its own as a separate embodiment. The scope of the embodiments disclosed herein is to be determined with reference to the appended claims, along with the full scope of equivalents to which such claims are entitled.

What is claimed is:

1. A power harvesting drone, comprising:
   a motor assembly;
   an energy replenishment coupler;
   a processor communicatively coupled to the energy replenishment coupler; and
   memory storing instructions that, when executed by the processor, cause the processor to:
   operate the power harvesting drone to navigate a pre-determined path;
   determine that a power supply used to operate the power harvesting drone is below a threshold of remaining power;
   identify an opportunistic energy source; and
   deviate from the predetermined path to replenish at least a portion of the power supply from the opportunistic energy source using the energy replenishment coupler onboard the power harvesting drone,
   wherein to identify the opportunistic energy source, the processor is to:
   communicate with a different drone; and
   receive from the different drone a set of opportunistic energy sources ranked by a cost to replenish the power supply.

2. The power harvesting drone of claim 1, wherein the motor assembly includes a flight mechanism.

3. The power harvesting drone of claim 1, wherein the threshold of remaining power is an amount of remaining power that is enough for the power harvesting drone to complete navigating the predetermined path.

4. The power harvesting drone of claim 1, wherein to identify the opportunistic energy source, the processor is to:
   communicate with a server; and
   receive from the server a second set of opportunistic energy sources.

5. The power harvesting drone of claim 1, wherein the set of opportunistic energy sources is ranked by distance away from the power harvesting drone.

6. The power harvesting drone of claim 1, wherein to identify the opportunistic energy source, the processor is to:
   survey an area around the power harvesting drone using a sensor array on the power harvesting drone; and
   identify the opportunistic energy source based on the survey.

7. The power harvesting drone of claim 6, wherein the sensor array includes a camera, and wherein to survey the area, the processor is to:
   perform an image analysis to identify the opportunistic energy source.

8. The power harvesting drone of claim 1, wherein the opportunistic energy source comprises a power line.

9. The power harvesting drone of claim 8, wherein the energy replenishment coupler comprises an inductive coupling device.

10. The power harvesting drone of claim 1, wherein the opportunistic energy source comprises a water way.

11. The power harvesting drone of claim 10, wherein the energy replenishment coupler comprises a hydro turbine.

12. The power harvesting drone of claim 1, wherein the opportunistic energy source comprises a moving vehicle.

13. The power harvesting drone of claim 12, wherein the energy replenishment coupler comprises a vibration-powered generator.

14. A method of deploying a power harvesting drone, the method comprising:
   operating the power harvesting drone to navigate a pre-determined path;
   determining that a power supply used to operate the power harvesting drone is below threshold of remaining power;
   identifying an opportunistic energy source by:
   communicating with a different drone; and
   receiving from the different drone a set of opportunistic energy sources ranked by a cost to replenish the power supply; and
   deviating from the predetermined flight path to replenish at least a portion of the power supply from the opportunistic energy source using an energy replenishment coupler onboard the power harvesting drone.

15. The method of claim 14, wherein deviating from the predetermined path to replenish at least a portion of the power supply from the opportunistic energy source includes:
   identifying a motor vehicle traveling in a direction compatible with the path;
   navigating to the motor vehicle;
   causing the power harvesting drone to couple with the motor vehicle;
   causing the power harvesting drone to decouple from the motor vehicle; and
   resuming the predetermined path.

16. The method of claim 15, further comprising:
   causing the power harvesting drone to replenish the power supply while coupled to the vehicle.

17. The method of claim 16, wherein to replenish the power supply, the power harvesting drone is to implement a wind generator to replenish a battery on the power harvesting drone.

18. The method of claim 16, wherein to replenish the power supply, the power harvesting drone is to implement a vibration-powered generator to replenish a battery on the power harvesting drone.

19. At least one non-transitory machine-readable medium including instructions for deploying a power harvesting drone, which when executed by a machine, cause the machine to:
   operate the power harvesting drone to navigate a predetermined path;
   determine that a power supply used to operate the power harvesting drone is below a threshold of remaining power;
   identify an opportunistic energy source; and
   deviate from the predetermined flight path to replenish at least a portion of the power supply from the opportunistic energy source using an energy replenishment coupler onboard the power harvesting drone,
   wherein to identify the opportunistic energy source, the instructions cause the machine to:
   communicate with a different drone; and receive from the different drone a set of opportunistic energy sources ranked by a cost to replenish the power supply.

20. The at least one non-transitory machine-readable medium of claim 19, wherein the instructions identify the opportunistic energy source include instructions to:
survey an area around the power harvesting drone using a sensor array on the power harvesting drone; and
identify the opportunistic energy source based on the survey.

21. The at least one non-transitory machine-readable medium of claim 19, wherein the instructions to deviate from the predetermined path to replenish at least a portion of the power supply from the opportunistic energy source include instructions to:
identify a motor vehicle traveling in a direction compatible with the path;
navigate to the motor vehicle;
cause the power harvesting drone to couple with the motor vehicle;
cause the power harvesting drone to decouple from the motor vehicle; and
resume the predetermined path.

22. The at least one non-transitory machine-readable medium of claim 21, further comprising instructions to:
cause the power harvesting drone to replenish the power supply while coupled to the vehicle, wherein to replenish the power supply, the power harvesting drone is to implement a thermoelectric generator to replenish a battery on the power harvesting drone.

* * * * *

UNITED STATES PATENT AND TRADEMARK OFFICE
CERTIFICATE OF CORRECTION

PATENT NO. : 10,427,785 B2
APPLICATION NO. : 15/476558
DATED : October 1, 2019
INVENTOR(S) : Needham et al.

Page 1 of 1

It is certified that error appears in the above-identified patent and that said Letters Patent is hereby corrected as shown below:

In the Claims

In Column 22, Line 18, in Claim 14, after "below", insert --a--

In Column 23, Line 5, in Claim 20, after "instructions", insert --to--

Signed and Sealed this
Thirty-first Day of March, 2020

Andrei Iancu
*Director of the United States Patent and Trademark Office*